(12) United States Patent
Tolle et al.

(10) Patent No.: US 10,053,774 B2
(45) Date of Patent: Aug. 21, 2018

(54) REACTOR SYSTEM FOR SUBLIMATION OF PRE-CLEAN BYPRODUCTS AND METHOD THEREOF

(71) Applicant: ASM IP HOLDING B.V., Almere (NL)

(72) Inventors: John Tolle, Phoenix, AZ (US); Eric Hill, Phoenix, AZ (US)

(73) Assignee: ASM IP Holding B.V., Almere (NL)

( * ) Notice: Subject to any disclaimer, the term of this patent is extended or adjusted under 35 U.S.C. 154(b) by 178 days.

(21) Appl. No.: 14/738,012

(22) Filed: Jun. 12, 2015

(65) Prior Publication Data

US 2016/0362783 A1 Dec. 15, 2016

(51) Int. Cl.

| | |
|---|---|
| *C23C 16/44* | (2006.01) |
| *C23C 16/458* | (2006.01) |
| *H05B 6/10* | (2006.01) |
| *C23C 16/46* | (2006.01) |
| *C23C 14/02* | (2006.01) |
| *C23C 14/50* | (2006.01) |
| *C23C 16/02* | (2006.01) |

(52) U.S. Cl.
CPC ........ *C23C 16/4405* (2013.01); *C23C 14/021* (2013.01); *C23C 14/50* (2013.01); *C23C 16/0209* (2013.01); *C23C 16/0218* (2013.01); *C23C 16/458* (2013.01); *C23C 16/4582* (2013.01); *C23C 16/46* (2013.01); *H05B 6/105* (2013.01)

(58) Field of Classification Search
CPC .......... C30B 25/10; C30B 25/12; H05B 6/00; H05B 6/02; H05B 6/04; H05B 6/06; H05B 6/10; H05B 6/105; C23C 16/46; C23C 16/458; C23C 16/4405; C23C 14/021; C23C 14/50; C23C 16/0209; C23C 16/0218; C23C 16/4582; C23C 16/548

See application file for complete search history.

(56) References Cited

U.S. PATENT DOCUMENTS

| | | | | |
|---|---|---|---|---|
| 7,393,418 | B2* | 7/2008 | Yokogawa | .......... C23C 16/4581 118/500 |
| 2002/0119642 | A1* | 8/2002 | Shibata | ............... C23C 16/4583 438/479 |
| 2004/0089236 | A1* | 5/2004 | Yokogawa | .......... H01L 21/6875 118/715 |
| 2009/0255901 | A1* | 10/2009 | Okita | .................... H01J 37/321 216/67 |
| 2012/0024231 | A1* | 2/2012 | Horino | .................... C30B 25/12 118/725 |
| 2012/0264051 | A1* | 10/2012 | Angelov | ............... H01L 21/683 430/256 |
| 2015/0267295 | A1 | 9/2015 | Hill et al. | |
| 2015/0267301 | A1 | 9/2015 | Hill et al. | |

OTHER PUBLICATIONS

Unpublished U.S. Appl. No. 14/465,252, filed Aug. 21, 2014. Title: Method and System for In Situ Formation of Gas-Phase Compounds. Inventors: John Tolle; Eric Hill; Jereld Lee Winkler.

* cited by examiner

*Primary Examiner* — Michael Barr
*Assistant Examiner* — Benjamin L Osterhout
(74) *Attorney, Agent, or Firm* — Sand & Sebolt

(57) ABSTRACT

A reactor system and related methods are provided which may include a heating element in a wafer tray. The heating element may be used to heat the wafer tray and a substrate or wafer seated on the wafer tray within a reaction chamber assembly, and may be used to cause sublimation of a native oxide of the wafer.

8 Claims, 2 Drawing Sheets

REACTOR SYSTEM FOR SUBLIMATION OF PRE-CLEAN BYPRODUCTS AND METHOD THEREOF

BACKGROUND

Technical Field

The technical field relates to the fabrication of integrated circuits, particularly to methods and devices for pre-cleaning a wafer or substrate surface.

Background Information

Integrated circuit fabrication often involves formation of one or more material layers on a substrate (also referred to as a "wafer") surface. These material layers can include, for example, mono-crystalline, polycrystalline, or other amorphous material layers. Formation of the material layers can be achieved using various thin film deposition techniques, including various physical deposition techniques, e.g., physical sputtering, or chemical deposition techniques, e.g. chemical vapor deposition (CVD), atomic layer deposition, or epitaxial deposition. For example, mono-crystalline material formation on a substrate surface can be performed using an epitaxial deposition process, such as for formation of mono-crystalline semiconductor materials (e.g., mon-crystalline silicon).

The presence of an intervening material (e.g., a native oxide layer, such as a silicon oxide material layer on a silicon wafer) on the wafer surface may interfere with formation of a desired material layer over the wafer surface. For example, the intervening material may cause introduction of an increased number of defects in the structure of the desired material layer or may adversely affect an electrical performance of the desired material layer. In some embodiments, an intervening material such as a native oxide material may form on a wafer surface due to exposure of the wafer to oxygen during the integrated circuit fabrication process, e.g., exposure to ambient air during transfer of the substrate between fabrication systems, or residual oxidizing agents within fabrication systems. Accordingly, fabrication techniques and systems to remove native oxide from a wafer may be desirable to facilitate subsequent deposition on a wafer surface.

SUMMARY

In one aspect, a reactor system may comprise a reaction chamber assembly defining an interior chamber; a susceptor within the interior chamber; a wafer tray seated on the susceptor and adapted to carry a wafer; and a heating element in the wafer tray adapted to heat the wafer tray to heat the wafer to a sublimation temperature.

In another aspect, a method may comprise the steps of placing a wafer on a wafer tray inside a reaction chamber assembly; and powering a heating element within the wafer tray to raise a temperature of the wafer tray from a first temperature to a second temperature to cause oxide material on the wafer to undergo sublimation inside the reaction chamber assembly.

In another aspect, a reaction chamber system may comprise a reaction chamber assembly defining an interior chamber; a wafer tray within the interior chamber; and at least one heating element carried by the wafer tray; wherein no heating elements are within the interior chamber other than the at least one heating element carried by the wafer tray.

BRIEF DESCRIPTION OF THE DRAWINGS

A sample embodiment is set forth in the following description, is shown in the drawings and is particularly and distinctly pointed out and set forth in the appended claims.

Similar numbers refer to similar parts throughout the drawings.

DETAILED DESCRIPTION

Figure 1:
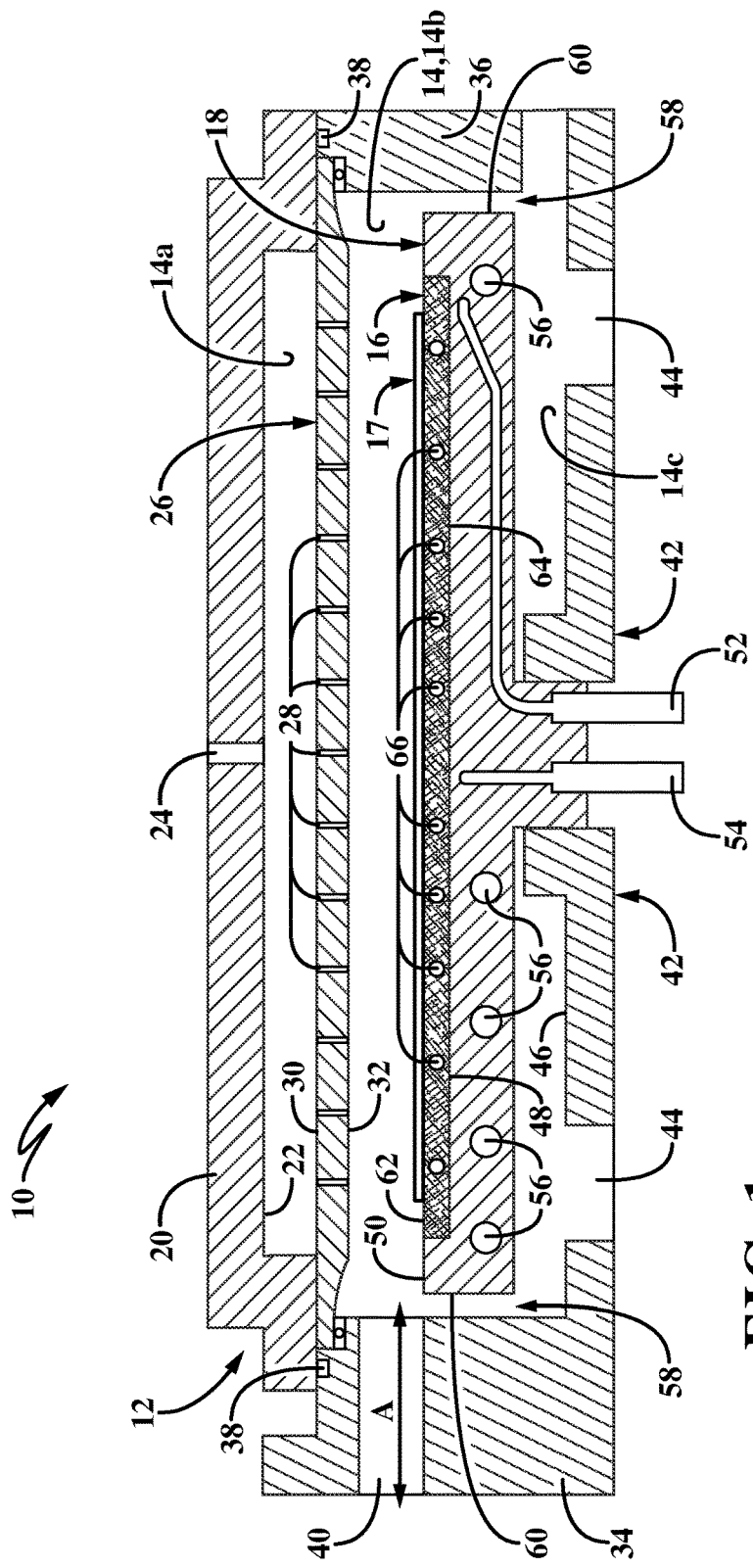
FIG. 1 is a cross section view of a reactor system used in the fabrication of integrated circuits.

FIG. 1 shows a reactor system 10 which may include a reaction chamber assembly 34. Assembly 34 which may include a top wall 20, an annular sidewall 36 connected to top wall 20, and a bottom wall 42 connected to sidewall 36. Reactor system 10/assembly 34 may include a showerhead 12 for directing process gases into an interior reaction chamber 14 defined by assembly 34 and particularly onto a wafer 17 to be processed. Interior chamber 14 may include an upper chamber region or area 14a, a middle or intermediate chamber region or area 14b and a lower chamber area 14c. System 10 may include a wafer tray 16 and a susceptor 18 which are disposed in interior chamber 14. Wafer tray 16 may be seated on or carried by susceptor 18 and may be configured to carry wafer 17 thereon.

Showerhead 12 may include upper rigid wall or gas channel plate 20, which has an upwardly facing top surface and a downwardly facing bottom surface 22 which may be similarly sized to the top surface. Bottom surface 22 defines a portion of interior chamber 14 upper region 14a. A gas inlet port or passage 24 may be formed through wall or member 20 extending from the top surface to bottom surface 22. Passage 24 may be configured to allow gas to flow therethrough from a gas supply external to chamber assembly 34 into upper chamber area 14a. Upper chamber area 14a may be defined between bottom surface 22 and an upwardly facing top surface 30 of a multi-passage manifold 26 of showerhead 12. Manifold 26 defines a plurality of through passages or holes 28 extending from top surface 30 to a bottom surface 32 of manifold 26 such that holes 28 are in fluid communication with upper chamber area 14a and intermediate chamber area 14b, whereby upper and intermediate chamber areas 14a and 14b are in fluid communication with one another via holes 28. Top surface 30 may partially define upper chamber 14a while bottom surface 32 may partially define a middle chamber area 14b of chamber 14.

Showerhead 12 may be disposed atop and removably mounted on sidewall 36, which may be a cylindrical or circular sidewall. A seal 38 may sealingly engage showerhead 12 and sidewall 36 to form an airtight or gastight seal between showerhead 12 and sidewall 36. Sidewall 36 may define a through passage or opening 40 extending radially (e.g., left-to-right) from the outer surface of sidewall 36 to the inner surface of sidewall 36 such that passage 40 is in fluid communication with interior chamber 14 and atmosphere external to chamber assembly 34. Bottom wall 42 may be secured to sidewall 36 adjacent the bottom of sidewall 36 and define a plurality of exit ports 44 which may permit gases contained within chamber 14 to exit therethrough. A top surface 46 of bottom wall 42 may partially define lower chamber area 14c.

Susceptor 18 may be formed of metal (e.g., an aluminum alloy), graphite or another suitable material. Susceptor 18 may be configured to receive and retain wafer 17 carried by wafer tray 16 thereby retaining the wafer 17 in place during processing such as during a sublimation process. Susceptor 18 includes a recess 48 extending downwardly a short distance from a top surface 50 of susceptor 18. Top surface 50 may be a circular annular upwardly facing surface, and recess 48 may be circular as viewed from above. Recess 48 may have a vertical depth equal to or similar to a vertical height of tray 16, which may be received in recess 48. Wafer tray 16 and recess 48 may be sized such that when substrate or wafer 17 is placed on wafer tray 16, the top surface of substrate or wafer 17 may be substantially coplanar with top surface 50 of susceptor 18. Such a configuration may facilitate or allow substantially laminar flow and/or substantially uniform velocity of a gas or gases across the top surface of substrate 17 as the gas or gases move into chamber 14 through opening 40. Susceptor 18 may also include a first temperature measurement device or sensor 52 and a second temperature measurement device or sensor 54. Susceptor may further define a plurality of cooling channels 56 configured to maintain susceptor 18 at a desired temperature as heating elements inside the wafer tray 16 are heated. Cooling channels 56 may be in fluid communication with a cooling liquid source, such as water, and a pump to move the water or other cooling liquid through cooling channels 56.

Susceptor 18 may be fixedly attached to bottom wall 42 or otherwise disposed in chamber 14 such that susceptor 18 does not move relative to interior chamber 14 during the various steps of processing wafer 17 in chamber assembly 34. A gap or channel 58 may be extend between and provide fluid communication between middle chamber area 14b and lower chamber area 14c. Gap 58 may be an annular gap which may extend circumferentially all the way around an outer perimeter 60 of susceptor 18 between sidewall 36 and susceptor outer perimeter 60. Further, a width of channel 58 can vary to provide desired flow across top surface 50 and the top of wafer tray 16 as is understood in the art. For example, gap 58 can include a narrow width in an area near a vacuum source and include a relatively wide width away from a vacuum source. A width of the gap 58 may be within a range of from greater than 0 millimeters (mm) to about 4 mm, or from about 0.5 mm or 1.0 mm to about 3.0 or 4.0 mm, and may be about 2.0 mm. Gap 58 may taper from top to bottom (top surface 50 to a bottom surface of susceptor 18) such that gap 58 is either wider at its top than at its bottom or narrower at its top than at its bottom.

Wafer tray 16 may have a relatively low mass, which allows it to heat up quickly. The mass of the wafer tray may be in a range from about 0.4 or 0.5 kilograms to about 1.0, 1.1, 1.2, 1.3, 1.4 or 1.5 kilograms. Wafer tray 16 has an upwardly facing top surface 62 and a downwardly facing bottom surface 64. Bottom surface 64 may contact an upwardly facing surface of susceptor 18 when wafer tray 16 is within recess 48. Top surface 62 may be essentially coplanar with top surface 50 of susceptor 18. Wafer tray 16 may have an essentially circular outer perimeter which extends from top surface 62 to bottom surface 64 and defines an outer diameter of tray 16 which in one embodiment may be in a range of about 280, 290 or 300 mm to about 310, 320 or 330 mm, and may be about 305 mm. Wafer tray 16 may define a recess therein. Wafer tray 16 may be formed of a relatively non-reactive material, such as a non-metal material. Some materials suitable for wafer tray 16 may include one or more of alumina, boron nitride, and silicon carbide. Wafer tray 16 can comprise, consist essentially of, or consist of such materials. In one particular example, wafer tray 16 consists essentially of silicon carbide (SiC). Wafer tray 16 may also comprise, consist essentially of, or consist of materials such as aluminum nitride (AlN) or boron nitride (BN).

The thickness of wafer tray 16 can vary according to the dimensions of wafer 17 to be sublimated thereon. By way of example, wafer tray 16 may have a thickness (which may be a vertical thickness when tray 16 is essentially horizontal) defined between top and bottom surfaces 62 and 64. This thickness may, for example, be no more than 5.0 mm and may be within a range of from about 1.0 mm to about 5.0 mm, or from about 2.0 mm to about 4.5 mm, or from about 3.0 mm to about 4.0 mm thick, and may be about 3.5 mm thick. As shown in FIG. 1, top surface 62 of wafer tray 16 may be at the same height as top surface 50 of susceptor 18, such that the thickness of wafer tray 16 may be equal to the vertical depth of recess 48 inside which tray 16 may be seated or nest. Thus, recess 48 of susceptor 18 can have a vertical depth in the same ranges noted above for the thickness of wafer tray 16.

A recess may be formed in wafer tray 16 which extends downwardly from top surface 62 and may be configured to receive and retain wafer 17 in place during sublimation processing. Such a recess formed in wafer tray 16 may have a vertical depth substantially equal to the height or vertical thickness of wafer 17 although this may vary, and wafer 17 may extend slightly above top surface 62 of wafer tray 16. The recessed surface which may define a bottom of such a recess in wafer tray 16 (or the upwardly facing surface of wafer tray 16 on which the bottom surface of wafer 17 is seated) may be entirely or may include a portion that which is relatively smooth, for example, having a roughness average (Ra) of 0.4 μm or less to mitigate reactants reacting with a bottom surface of the substrate. The recess formed in top surface 62 can be shaped such that a perimeter of the recess may be substantially similar to the perimeter of the wafer 17. By way of example, when wafer 17 may be substantially cylindrical or circular as viewed from above, then the recess formed in top surface 62 may also be substantially cylindrical or circular as viewed from above or have a shape of a shallow cylinder, having a height substantially equal or slightly shallower than the height of the wafer 17 and a diameter slightly larger in diameter than the wafer. Wafer tray 16 may include apertures formed therein extending from top surface 62 to bottom surface 64 adapted to receive push pins therethrough allowing a wafer resting atop susceptor 16 and engaging or contacting wafer tray 16 to be pushed upwardly out of engagement with wafer tray 16.

At least one heating element 66 may be disposed within or embedded in wafer tray 16 between top surface 62 and bottom surface 64. Heating element 66 may be a tungsten based resistive heating element powered from a dedicated power source configured to heat up to a temperature generally not exceeding about 700° C. Although heating element 66 may be about 700° C. or another temperature, wafer 17 and wafer tray 16 may not reach such temperature and may be substantially less. For example, if sublimation of an oxide layer on wafer 17 occurs at or around a sublimation temperature of 100° C., the heating element 66 may be at a temperature greater than the sublimation temperature, for example about 400° C. Thus, while element 66 may be at 400° C. within wafer tray 16, temperature conduction may occur from element 66 through wafer tray 16 to and through wafer 17 to raise wafer 17 or the surfaces of wafer 17 to the sublimation temperature at or around 100° C. The heat transfer to wafer 17 will depend on the chamber environment (pressure, gas type, gas flow). The sublimation phase change may occur even though the heating element may be hotter than the sublimation temperature.

While the heating element 66 may comprise, consist essentially of, or consist of tungsten (W), heating element 66 may alternately comprise, consist essentially of, or consist of molybdenum (Mo), may include both of these elements or may be formed of another suitable material. Heater element 66 may be encased in graphite and with the graphite-encased element coated with SiC, AlN or BN. Heating element 66 inside wafer tray 16 preferably has its own dedicated power supply and thermocouples. Furthermore, heating element 66 may be configured to heat up or ramp up in temperature at a very fast rate. For example, element 66 may heat up at a temperature ramping rate which may be in a range of about 50° C./second to about 200° C./second, or from about 75° C./second to about 150° C./second or 175° C./second, and may be about 100° C./second.

Heating element 66 may thus be located inside the wafer tray 16 rather than in another location, such as within the susceptor 18. Recess 48 formed in the top surface 50 of the susceptor 18 may have a vertical recess depth equal to a first vertical distance so that when wafer tray 16 is disposed within recess 48, a bottom surface of wafer 17 when wafer 17 is carried by or seated on/atop wafer tray 16 may be located a second vertical distance from a top or top surface of heating element 66. Stated another way, the second vertical distance inside tray 16 may be measured from the bottom surface of the wafer to the top of heating element 66 and the second distance may be less than the first distance. Thus, if the first distance (the recess depth or distance of recess 48) is about 3.5 mm, then the distance from the bottom surface of wafer 17 to the top of heater element 66 inside tray 16 may be less 3.5 mm.

Wafer 17 surface may comprise a silicon nitride material (e.g., a silicon nitride material used in formation of various electronic devices on the wafer surface, including spacer features for the electronic devices) and a silicon oxide material which is to be removed by the pre-clean process. A silicon oxide material on the wafer 17 surface can be selectively removed relative to a silicon nitride material on the substrate surface at a selectivity of greater than about 7:1. In some embodiments, the selectivity of a pre-clean process form removing silicon oxide relative to silicon nitride can be about from about 6:1 to about 150:1. For example, the selectivity can be from about 6:1 to about 60:1, or from about 7:1 to about 15:1, or from about 8:1 to about 15:1, or from about 8:1 to about 12:1.

Wafer 17 may be maintained at a desired temperature during formation of the pre-clean material, including for example while the wafer 17 surface is exposed to a reactant gas of the pre-clean process. In some embodiments, the wafer 17 may be maintained at a temperature above a condensation temperature of the reactant gas during formation of the pre-clean material. For example, the wafer 17 may be maintained at a temperature greater than about 15° C., or greater than about 20° C. In some other embodiments, wafer 17 can be maintained at a temperature in a range of about 15° C. to about 50° C., or about 15° C. to about 30° C., or about 25° C. to about 30° C. For example, wafer 17 can be maintained at a temperature in a range of about 22° C. to about 28° C., which can facilitate a high selectivity for the removal of silicon oxide relative to silicon nitride material on wafer 17 surface.

A process for integrated circuit fabrication may include pre-cleaning a wafer surface to remove undesired material. The undesired material may comprise an oxide material (e.g., a native silicon oxide material formed on a silicon wafer) in some embodiments. Deposition of a pre-clean material and subsequent volatilization or sublimation of the pre-clean material can advantageously cause removal of the oxide material from the wafer surface.

By way of further example, and not by way of limitation, to form the pre-clean material, reactant species flow into a reaction chamber during a pre-clean process and chemically interact with the undesired material on the wafer surface. In some embodiments, the pre-clean material may comprise one or more components generated from chemical reactions between reactant species and a wafer surface oxide material or chemical reactions between the reactant species themselves. For example, a pre-clean process may use a reactant gas comprising halogen such that the halogen-containing reactant gas chemically reacts with the wafer surface silicon oxide to form a pre-clean material comprising halogen and silicon.

In some embodiments, the oxide removal may be accomplished by volatizing the pre-clean material, by way of sublimation. A target material can be formed on the pre-cleaned wafer surface, including for example deposition of a conductive material. The conductive material can include, without limitation, a semiconductor-containing material (i.e., a silicon-containing material), a metal-containing material, or combination thereof. As used herein, a target material is a material deposited directly in contact with the pre-clean wafer surface. In addition, removing the pre-clean material can include removing all or part of the pre-clean material from the wafer. In some embodiments, the wafer from which the native oxide material is removed may be patterned (i.e., have a pattern of recesses such as trenches on its surface). In some embodiments, the substrate may include exposed electronic devices (i.e., transistor structures).

In some embodiments, the reaction chamber can be an epitaxial deposition chamber and the target material can be mono-crystalline silicon. For example, the pre-clean material can be removed from the wafer by sublimation in the reaction chamber to provide a pre-clean wafer surface, and epitaxial growth of silicon can be subsequently performed on the pre-cleaned wafer surface in the reaction chamber to form a mono-crystalline silicon layer on the wafer.

In one particular example, the pre-clean process of sublimating a native oxide layer from the wafer surface occurs in the same reaction chamber as the subsequent growth of a mono-crystalline silicon layer on the wafer. Removal of the pre-clean material in the same reaction chamber in which target material is subsequently formed on the wafer may advantageously provide quality surface for the later deposition of the target material. Further, it may advantageously provide a chamber that may be free of or essentially free of undesired contaminant materials. For example, the pre-clean material may provide a protective layer over the wafer surface, reducing or preventing or substantially preventing additional oxidation from occurring on the wafer surface during transport of the wafer to the reaction chamber for target material deposition. In some embodiments, removal of the pre-clean material in the same reaction chamber in which the target material is subsequently formed may facilitate deposition of a target material having a reduced defect count or improved electrical performance or both. In some embodiments, removal of the pre-clean material in the same reaction chamber in which target material is subsequently formed may facilitate transport of the wafer outside of a vacuum environment subsequent to the pre-clean process. Further, use of reaction chambers not vacuum coupled to one another (i.e., use of reaction chambers not coupled to one another through various gating valves, such as reaction chamber in a cluster tool) may also facilitate transport of the wafer outside of a vacuum environment subsequent to the pre-clean process.

In some embodiments, a pre-clean process can include a plurality of cycles, where each cycle can include forming a pre-clean material and removing the pre-clean material. A pre-clean process including more than one cycle may advantageously demonstrate exceptionally high selectivity. For example, as compared to selectivity performance of a first cycle of a pre-clean process, a second cycle and other subsequent cycles of the pre-clean process can demonstrate significantly higher selective removal of native silicon oxide from the wafer surface relative to removal of another material, such as silicon nitride, from the wafer surface.

The composition of the reactant gas of the pre-clean process can include one or more carrier gases. A suitable carrier gas can include any number of inert gases. In some embodiments, the carrier gas can comprise argon (Ar). In some embodiments, the reactant gas can also include halogen-containing gas. For example, the halogen-containing gas can be a fluorine-containing gas. Suitable fluorine-containing gases can include without limitation, nitrogen trifluoride ($NF_3$), hydrogen fluoride (HF), or diatomic fluorine ($F_2$). In some embodiments, the reactant gas can also include a hydrogen-containing gas. A suitable hydrogen-containing gas can include, for example, ammonia ($NH_3$).

The pre-clean material can comprise one or more components formed by reaction of the reactant gas and a wafer surface silicon oxide. For example, a reactant gas comprising ammonia, and one or more fluorine-containing compounds can chemically react with the silicon oxide to generate water vapor, and a pre-clean material comprising nitrogen, hydrogen, and silicon. In some embodiments, ammonia and nitrogen trifluoride, hydrogen fluoride, or fluorine can react with silicon oxide to provide a pre-clean material comprising ammonium hexafluorosilicate or $(NH_4)_2SiF_6$. In some embodiments, the pre-clean material can comprise for example ammonium fluoride ($NH_4F$) or ammonium hydrogen fluoride ($NH_4HF_2$).

Without being limited by any particular theory or mode of operation, it is believed that ammonium fluoride ($NH_4F$) may be formed when a fluorine (F) atom from a halogen-containing constituent of the reactant gas (e.g., $NF_3$, HF, and/or $F_2$) reacts with ammonia ($NH_3$) to form hydrogen fluoride (HF), which can combine with ammonia ($NH_3$) to form ammonium fluoride ($NH_4F$). In some embodiments, ammonium fluoride can remove silicon oxide by decomposing and reacting with silicon oxide to form silicon tetrafluoride ($SiF_4$) and water vapor ($H_2O$), and the tetrafluoride ($SiF_4$) can combine with $NH_4F$ to form ammonium hexafluorosilicate, wherein the ammonium hexafluorosilicate forms a film layer on the substrate surface. For example, the electronegative fluorine (F) of ammonium fluoride can be attracted to the relatively more electropositive silicon (Si) of the silicon oxide, while ammonium ($NH_4$) can be attracted to oxygen (O) of the silicon oxide. In some embodiments, a pre-clean material comprising ammonium hexafluorosilicate can be decomposed and/or volatilized by heating the substrate, for example decomposing to form tetrafluoride ($SiF_4$), ammonia ($NH_3$) and/or hydrogen fluoride (HF).

The pre-clean material may be removed (e.g., decomposed and/or volatilized) using various techniques. In some embodiments, the pre-clean material can be removed through heating of the wafer 17 to a temperature near, at, or above a sublimation temperature of components of the pre-clean material. For example, the wafer 17 can be heated by heating element 66 in wafer tray 16 to a temperature in a range of about 80° C. to about 500° C., including about 80° C. to about 100° C., under conditions that facilitate sublimation of the pre-clean material. For example, the wafer 17 can be heated to a temperature of about 100° C. to cause sublimation of the ammonium hexafluorosilicate. The sublimation temperature may be generally in a range from about 80° C. to about 120° C.

In accordance with one aspect, heating element 66 inside wafer tray 16 minimizes the amount of particles required for sublimation to occur. Minimizing the amount of particles for sublimation to occur refers to wafer 17 remaining stationary during the sublimation phase change of the oxide material on wafer 17 surface. Furthermore, the direction of the heat will come from underneath the wafer 17, not from above. Heating wafer 17 from below its bottom surface should limit the addition of any particles generated during the sublimation.

Figure 2:
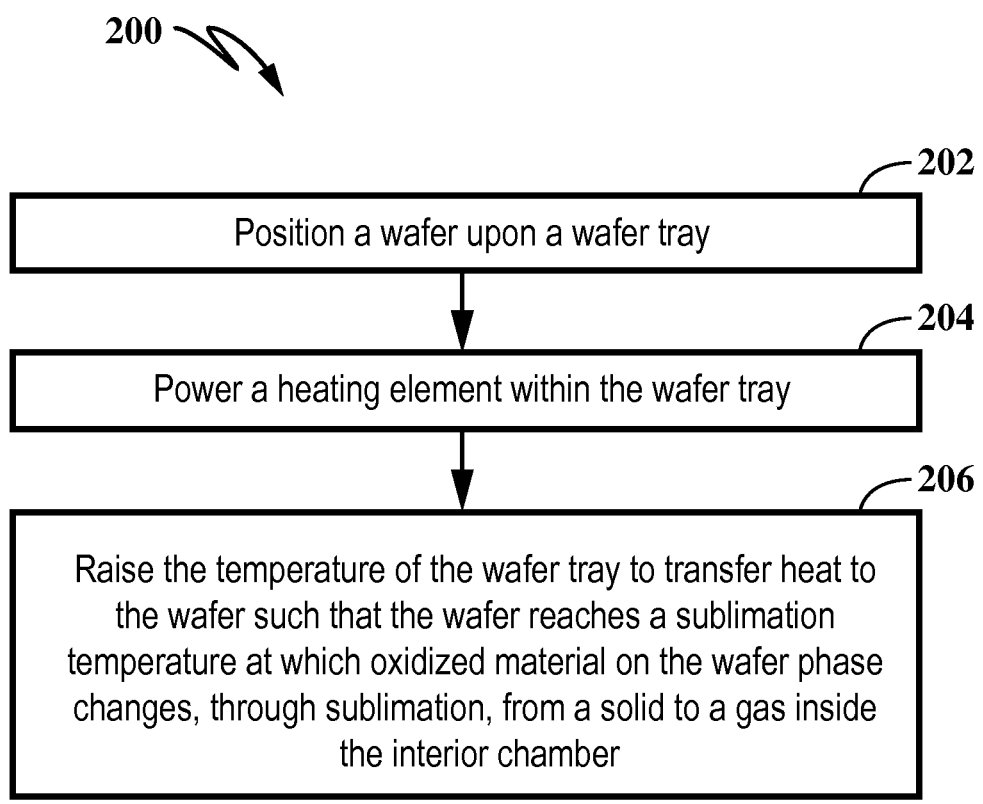
FIG. 2 is a flow chart of a method for sublimating oxide materials on a wafer inside a reactor system.

As depicted in FIG. 2, a method 200 is shown for sublimating oxide materials on a wafer inside an interior chamber of a reactor system using a wafer tray with a heating element therein. Method 200 may include various steps, such as positioning the wafer upon the wafer tray, as shown generally at 202. Wafer 17 may be moved through opening 40 in the direction of Arrow A (FIG. 1) to position it on the wafer tray 16. The step of powering the heating element within the wafer tray, is shown generally at 204. In one exemplary embodiment, heating element(s) 66 is/are powered from a dedicated power supply. The step of raising the temperature of the wafer tray from a first temperature to a second temperature, wherein when the wafer reaches the second temperature, oxide material on the wafer phase changes, through sublimation, from a solid to a gas inside the interior chamber, is shown generally at 206. In one exemplary embodiment, the second temperature may be a sublimation temperature generally around 100° C.

In some embodiments, heating element 66 inside wafer tray 16 will be heated/initiated after the pre-clean process (conversion of the oxide layer). Further, it is possible for heating element 66 to also be used to maintain the temperature of the wafer 17 during the pre-clean process. The cooling channels 56 may cooperate with the heating element to maintain (via cooling) a desired temperature of wafer 17 in the event wafer 17 becomes too hot from heat transferred from element 66 to wafer 17.

Method 200 may comprise some additional steps including, by way of example and not by limitation, wherein the first temperature is in range from about 15° C. to about 30° C. and wherein the second temperature may be in a range from about 75° C. to about 150° C. Additionally, method 200 may include the step of raising the temperature of the heating element within the wafer tray at the temperature ramping rate discussed previously, which may be in a range of about 50° C./second to about 200° C./second, or from about 75° C./second to about 150° C./second or 175° C./second, and may be about 100° C./second. Likewise, the temperature of wafer 17 and all its surfaces may be rapidly raised as a result of heat being transferred from the rapidly heated heating element 66 to wafer 17, whereby the heating or raising of the temperature of wafer 17 may occur at a ramping rate within the same range as the ramping rate for heating element 66 noted immediately above.

Further, method 200 may include wherein the step of powering the heating element 66 may be accomplished from a dedicated power supply. Method 200 may also include the steps of positioning the a bottom surface on the wafer 17 a vertical distance away from the heating element in the wafer tray, wherein the vertical distance from the bottom surface on the wafer 17 to a top surface of the heating element 66 may be less than the vertical recess depth of the recess 48. Method 200 can also include cooling the wafer tray 16 with a susceptor 18 which defines a plurality of cooling channels 56 and serves as a heat sink which absorbs heat energy from wafer tray 16. Method 200 may also include, simultaneous to the raising the temperature of the wafer tray 16 from the first temperature to the second temperature comprising the step of maintaining the wafer 17 a constant vertical height. Even further, method 200 may include the steps of passing one of a plasma-phase element and a gas-phase chemical element over the wafer 17 to treat and react with a native oxide layer on the wafer 17 inside the interior chamber 14; and initiating a sublimation phase change inside the interior chamber 14, wherein native oxide treatment and sublimation all occurring inside the interior chamber 14 may prevent or substantially reduce contamination by foreign particles ordinarily occurring during a transfer of a wafer 17 between two chambers. Additionally, method 200, after sublimation of the oxide material, may further comprise the steps of removing the wafer 17 from the wafer tray 16 and from the interior chamber 14; maintaining power to the heating element 66 16 to keep the wafer tray heated to a temperature in a range from about 80° C. degrees to about 120° C.; positioning a second wafer on the wafer tray 16 inside the interior chamber 14, the second wafer including a solid-phase native oxide layer; sublimating the oxide layer from the second wafer in no more than about two (2.0) seconds. The step of raising the temperature of wafer 17 on wafer tray 16 may be accomplished by heating wafer 17 from below wherein the susceptor 18 supporting wafer tray 16 from below is free of or includes no heating elements.

In the foregoing description, certain terms have been used for brevity, clearness, and understanding. No unnecessary limitations are to be implied therefrom beyond the requirement of the prior art because such terms are used for descriptive purposes and are intended to be broadly construed.

Moreover, the description and illustration set out herein are an example and the invention is not limited to the exact details shown or described.

The invention claimed is:

1. A reactor system comprising:
   a reaction chamber assembly defining an interior chamber;
   a susceptor within the interior chamber;
   a wafer tray seated on the susceptor and adapted to carry a wafer; and
   a heating element in the wafer tray adapted to heat the wafer tray to heat the wafer to a sublimation temperature;
   wherein the wafer tray has a mass in a range of about 0.4 kilograms to about 1.5 kilograms; and
   wherein the wafer tray comprises a wafer tray recess configured to receive and retain the wafer, the wafer tray recess having an upwardly facing surface having a roughness average (Ra) of 0.4 µm or less across the entire upwardly facing surface.

2. The reactor system of claim 1 wherein the wafer tray has a thickness which is no more than 5 millimeters.

3. The reactor system of claim 1 wherein the wafer tray comprises one of aluminum nitride and boron nitride.

4. The reactor system of claim 1 in combination with the wafer, which has a bottom surface; wherein the wafer tray is within a susceptor recess; and further comprising:
   the susceptor recess formed in the susceptor extending downwardly from a top surface of the susceptor and having a vertical recess depth; and
   a vertical distance from the bottom surface of the wafer to a top surface of the heating element, wherein the vertical distance is less than the recess depth.

5. The reactor system of claim 4 wherein the vertical distance is no more than about 3.5 mm.

6. The reactor system of claim 1 in combination with the wafer;
   wherein the wafer has a native oxide layer and is carried by the wafer tray; and
   a power supply is operatively coupled to the heating element and capable of heating the heating element such that the heating element is capable of heating the wafer to a sublimation temperature of the oxide layer.

7. The reactor system of claim 1 wherein the susceptor includes no heating elements.

8. The reactor system of claim 1 further comprising:
   a power supply operatively coupled to the heating element and capable of heating the heating element at a temperature ramping rate in a range of about 50° C./second to about 200° C./second.

* * * * *